(12) United States Patent
Chuo et al.

(10) Patent No.: US 9,913,369 B2
(45) Date of Patent: Mar. 6, 2018

(54) CIRCUIT BOARD STRUCTURE WITH SELECTIVELY CORRESPONDING GROUND LAYERS

(71) Applicant: ADVANCED FLEXIBLE CIRCUITS CO., LTD., Taoyuan County (TW)

(72) Inventors: Chih-Heng Chuo, Taoyuan County (TW); Kuo-Fu Su, Taoyuan County (TW); Gwun-Jin Lin, Taoyuan County (TW)

(73) Assignee: Advanced Flexible Circuits Co., Ltd., Zhongli (TW)

( * ) Notice: Subject to any disclaimer, the term of this patent is extended or adjusted under 35 U.S.C. 154(b) by 0 days.

(21) Appl. No.: 15/450,204

(22) Filed: Mar. 6, 2017

(65) Prior Publication Data

US 2017/0325331 A1   Nov. 9, 2017

(30) Foreign Application Priority Data

May 9, 2016  (TW) .............................. 105114348 A

(51) Int. Cl.
*H05K 1/02* (2006.01)
*H05K 1/03* (2006.01)

(52) U.S. Cl.
CPC ......... *H05K 1/0245* (2013.01); *H05K 1/0216* (2013.01); *H05K 1/032* (2013.01); *H05K 1/0219* (2013.01); *H05K 1/0224* (2013.01)

(58) Field of Classification Search
CPC ...... H05K 1/0245; H05K 1/032; H05K 1/021; H05K 1/0212; H05K 1/0215; H05K 1/023; H05K 1/0231; H05K 1/0233; H05K 1/0234; H05K 1/0243; H05K 1/0295; H05K 1/14; H05K 1/141; H05K 1/142; H05K 1/144; H05K 1/145; H05K 1/16; H05K 1/162; H05K 1/18; H05K 1/181; H05K 1/182; H05K 1/183; H05K 1/184; H05K 1/185; H05K 2201/0317; H05K 2201/041;
(Continued)

(56) References Cited

U.S. PATENT DOCUMENTS 7,145,411 B1 * 12/2006 Blair ...................... H01P 3/006
                                                        333/247
7,292,452 B2 * 11/2007 Ng ........................ H05K 1/0245
                                                        174/250

(Continued)

*Primary Examiner* — Ishwarbhai B Patel
(74) *Attorney, Agent, or Firm* — Rosenberg, Klein & Lee

(57) ABSTRACT

A circuit board structure with selectively corresponding ground layers includes a first ground layer, a second ground layer, and a dielectric layer arranged between the first ground layer and the second ground layer to define a ground layer height difference between the first ground layer and the second ground layer. The first ground layer includes a plurality of non-electromagnetic shield areas. The circuit board includes a plurality of conductor wires formed thereon and selectively classified and divided into a first group of conductor wires and the second group of conductor wires. The first-group conductor wires are arranged to correspond to and electromagnetically couple to the first ground layer, and the second-group conductor wires are arranged to correspond to and electromagnetically couple to the second ground layer through the non-electromagnetic shield areas respectively, so that impedance value control is achieved.

19 Claims, 4 Drawing Sheets

(58) Field of Classification Search
CPC ... H05K 2201/049; H05K 2201/09763; H05K 2201/09872; H05K 2201/10446; H05K 2201/10454; H05K 2201/1046
See application file for complete search history.

(56) References Cited

U.S. PATENT DOCUMENTS

| | | | | |
|---|---|---|---|---|
| 8,013,255 | B2* | 9/2011 | Hsu | H05K 1/0245 174/254 |
| 2002/0060366 | A1* | 5/2002 | Kikuchi | H01L 23/13 257/776 |
| 2006/0237322 | A1* | 10/2006 | Hsu | H05K 1/0245 205/125 |

* cited by examiner

CIRCUIT BOARD STRUCTURE WITH SELECTIVELY CORRESPONDING GROUND LAYERS

BACKGROUND OF THE INVENTION

1. Field of the Invention

The present invention relates to a design of circuit board structure, and in particular to a circuit board structure with selectively corresponding ground layers.

2. The Related Arts

Contemporary electronic devices involve transmission of an extremely large amount of data through signal transmission wires and consequently, the number of signal transmission wires involved is great and the frequencies of the transmission signals are also very high.

In high frequency signal transmission techniques, generally, two high frequency signal wires are paired to form a differential-mode signal pair in which signals having identical amplitudes but opposite phases are respectively transmitted. Although such high frequency signal transmission techniques may effectively improve potential problems that might occur during the transmission of signals, poor designs may lead to issues of for example signal reflection, emission of electromagnetic waves, loss or missing of transmitted signals, and distortion of signal waveforms in actual applications.

Particularly, for situations where the substrate thickness of a flexible circuit board is reduced, those issues of signal transmission may get even worse. Factors that cause such issues may include: poor matching of characteristic impedance of the high frequency signal wires in an extension direction, poor control of parasitic capacitance between the high frequency signal wires and a ground layer, un-matching of characteristic impedance between the high frequency signal wires and connection pad formation zones. Such issues are generally due to poor designs of coupling between conductor wires laid on the circuit board and a corresponding ground layer.

Further, in order to have a contemporary circuit board fit to the needs of electronic products to be small, compact, and light-weighted, lay-out of conductor wires on a circuit board, in respect of conductor wire width/size and lay-out space, is subjected to severe constraint. It is thus a challenge of those involved in this field to provide a solution for laying fine and tiny conductor wires in a very limited area of a circuit board while effectively handling quality issues of signals transmitting through the conductor wires.

SUMMARY OF THE INVENTION

Thus, to overcome the above problems, an object of the present invention is to provide a circuit board structure with selectively corresponding ground layers. In the present invention, a plurality of conductor wires laid on a circuit board are selectively classified as different groups of conductor wires that are corresponding to and coupled to different ground layers respectively so as to improve signal transmission quality and also to meet the needs in association with conductor wire width/size of the wires laid on the circuit board and the space provided for wire laying.

The technical solution that the present invention adopts to achieve the above object is that a circuit board structure comprises a first ground layer and at least one second ground layer, and a dielectric layer arranged between the first ground layer and the second ground layer to define a ground layer height difference between the first ground layer and the second ground layer. The first ground layer comprises a plurality of non-electromagnetic shield areas extending along a laying path of a second group of conductor wires. A plurality of conductor wires formed on the circuit board are selectively classified into a first group of conductor wires and the second group of conductor wires. The first-group conductor wires are arranged to correspond to and electromagnetically couple to the first ground layer, and the second-group conductor wires are arranged to correspond to and electromagnetically couple to the second ground layer via the non-electromagnetic shield areas respectively, in respect of an impedance value control for the first-group conductor wires and the second-group conductor wires.

In the above circuit board structure, the plurality of conductor wires comprises one of at least a pair of differential-mode signal conductor wires and at least a pair of common-mode signal conductor wires.

In the above circuit board structure, the non-electromagnetic shield area of the first ground layer is filled with and leveled by a filling layer and the filling layer is formed of a material selected from one of a high dielectric constant material and a low dielectric constant material.

In the above circuit board structure, the substrate is formed of a material comprising one of polyethylene terephthalate (PET), polyimide (PI), and glass-reinforced epoxy resin (FR4).

In the above circuit board structure, the plurality of conductor wires are selectively classified into the first-group conductor wires and the second-group conductor wires according to one of conductor wire width and laying space limitation of the plurality of conductor wires.

In the above circuit board structure, the plurality of conductor wires are selectively classified into the first-group conductor wires and the second-group conductor wires according to one of signal frequency, impedance and signal attenuation toleration.

The above circuit board structure further comprises an insulation layer covering the conductor-laying surface of the substrate and the plurality of conductor wires. A metal layer is formed on the insulation layer.

In the above circuit board structure, the first ground layer further comprises a third group of conductor wires and a fourth group of conductor wires that are arranged to space from each other by a spacing distance and extending along the laying path.

Regarding to the efficacy, the present invention is structured to allow for selectively dividing the conductor wires of the circuit board, according to different signals (such as frequency and impedance, signal attenuation toleration, and laying space limitation) transmitted through the conductor wires, into different groups of conductor wires that are respectively corresponding to and coupled to different ground layers.

Further, the filling layer is formed of a material selected from one of a low dielectric constant material and a high dielectric constant material. By selecting a proper material for the filling layer, electrical characteristics for the second group of conductor wires corresponding to and coupled to the second ground layer can be changed.

Regarding the structural features, in designing wires laid on the circuit board, a designer may make correspondence and coupling with different ground layer according to constraints regarding wire with and laying space limitation of the circuit board, so as to increase the density of the conductor wires of the circuit board and effectively improve utilization of space.

BRIEF DESCRIPTION OF THE DRAWINGS

The present invention will be apparent to those skilled in the art by reading the following description of preferred embodiments of the present invention, with reference to the attached drawings, in which.

DETAILED DESCRIPTION OF THE PREFERRED EMBODIMENTS

Figure 1:
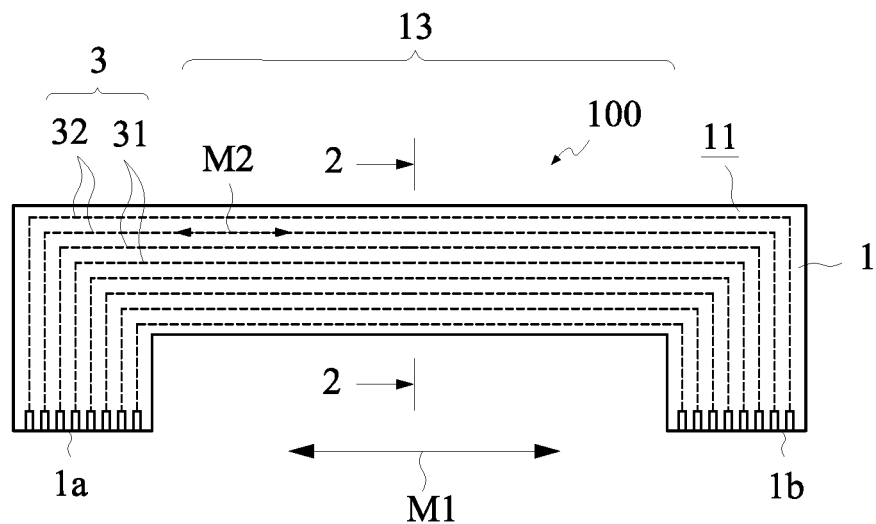
FIG. 1 is a plan view showing a circuit board structure according to a first embodiment of the present invention.
Figure 2:
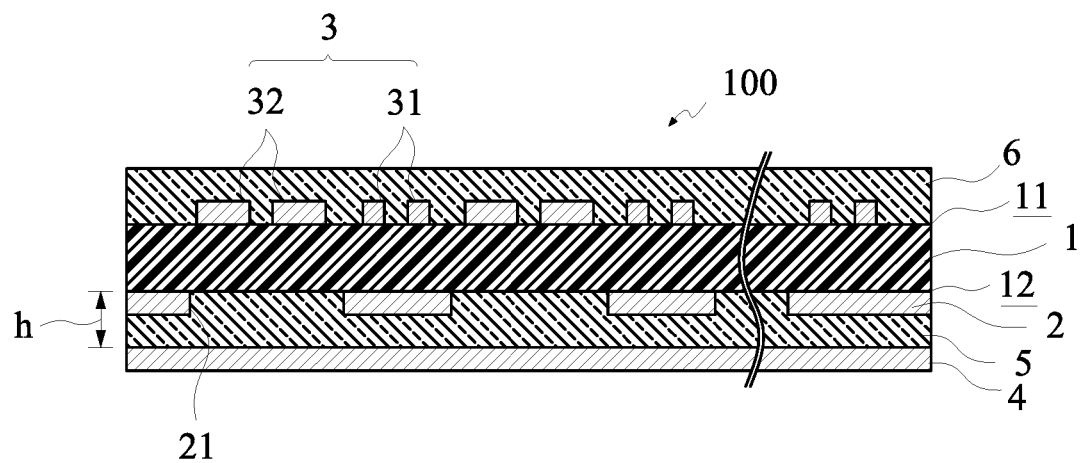
FIG. 2 is a cross-sectional view taken along line 2-2 of FIG. 1.

Referring to FIGS. 1 and 2, a plan view of a circuit board structure with selectively corresponding ground layers according to a first embodiment of the present invention and a cross-sectional view taken along line 2-2 of FIG. 1 are respectively shown. The circuit board structure with selectively corresponding ground layers according to the instant embodiment, generally designate at 100, comprises a substrate 1, which extends in an extension direction M1 and comprises a conductor-laying surface 11 and a grounding surface 12. The substrate 1 can be made of a flexible material, such as polyethylene terephthalate (PET) or polyimide (PI), or can be alternatively made of a rigid material, such as glass-reinforced epoxy (FR4).

An extension section 13 extends in the extension direction M1. The extension section 13 has a first end 1a and a second end 1b respectively provided with a plurality of conductive contact pads or alternatively formed as an insertion terminal. A first ground layer 2 is formed on the grounding surface 12 of the substrate 1.

A plurality of conductor wires 3 are provided on the conductor-laying surface 11 extending along a laying path M2 and is spaced from each other. Each of the conductor wires 3 extends through the extension section 13 and is selectively connected to the conductive contact pads provided on or the insertion terminal formed on the first end 1a and the second end 1b. The plurality of conductor wires 3 may comprise power wires, grounding wires, and/or signal wires, and may also comprises at least one pair of differential-mode signal wires for transmitting differential-mode signals or may comprise common-mode signal wires for transmitting common-mode signals.

In the present invention, the plurality of conductor wires 3 are selectively classified and divided into a first group of conductor wires 31 and a second group of conductor wires 32, which respectively extend along the laying path M2 on the conductor-laying surface 11 of the substrate 1. The classification of the first-group conductor wires 31 and the second-group conductor wires 32 is determined according to the frequency, impedance, and signal attenuation toleration of signals transmitted therethrough and a laying space limitation so as divide the conductor wires into different groups.

A second ground layer 4 is located below the first ground layer 2 and corresponds to the first ground layer 2. The second ground layer 4 and the first ground layer 2 are arranged to have a ground layer height difference h existing therebetween.

A dielectric layer 5 is interposed between the first ground layer 2 and the second ground layer 4 to maintain the ground layer height difference h between the first ground layer 2 and the second ground layer 4. An insulation layer 6 is set on and covers the substrate 1 and the plurality of conductor wires 3.

In the present invention, the first ground layer 2 comprises a plurality of non-electromagnetic shield areas 21 formed at a location corresponding to the second-group conductor wires 32 and extending along the laying path M2 of the second-group conductor wires 32. As such, the first-group conductor wires 31 of a plurality of conductor wires 3 correspond to and are coupled to the first ground layer 2, and the second-group conductor wires 32 correspond to and are coupled to the second ground layer 4 through the non-electromagnetic shield areas 21 respectively.

With the above-described arrangement of the present invention, corresponding and coupling to different ground layers can be made on the conductor wires of the circuit board according to frequency, impedance, and signal attenuation toleration of signals transmitted therethrough. For example, if the first-group conductor wires 31 are low impedance signal wires that transmits signals of high frequencies and the second-group conductor wires 32 are high impedance signal wires that transmit signals of high frequencies, since the first-group conductor wires 31 are corresponding to and coupled to the first ground layer 2 and the second-group conductor wires 32 are corresponding to and coupled to the second ground layer 4, the impedance value control of the first-group conductor wires 31 and the second-group conductor wires 32 can be achieved to keep the quality of transmission of signals.

Further, a filling layer 22 is formed of a low dielectric constant material or a high dielectric constant material. By selecting a proper material for the filling layer 22, electrical characteristics for the second-group conductor wires 32 corresponding to and coupled to the second ground layer 4 can be changed.

Regarding the structural features, in designing wires laid on the circuit board, a designer may make correspondence and coupling with different ground layer according to constraints regarding wire width and laying space limitation of the circuit board.

Figure 3:
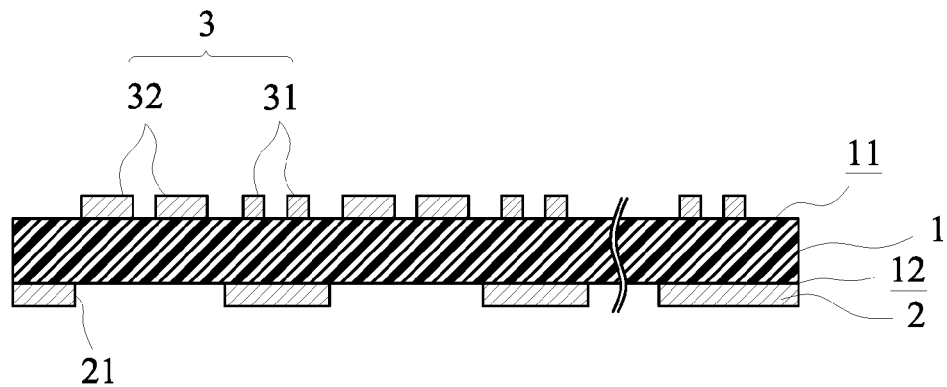
FIG. 3 is a first cross-sectional view illustrating manufacture of a circuit board according to a second embodiment of the present invention.
Figure 4:
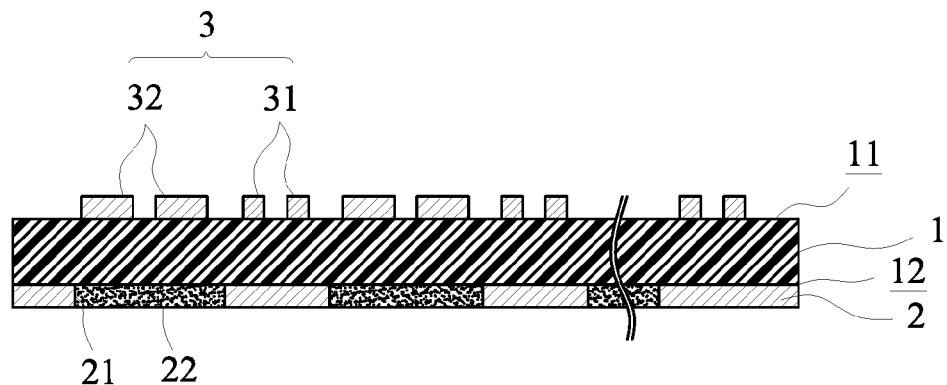
FIG. 4 is a second cross-sectional view illustrating the manufacture of the circuit board according to the second embodiment of the present invention.
Figure 5:
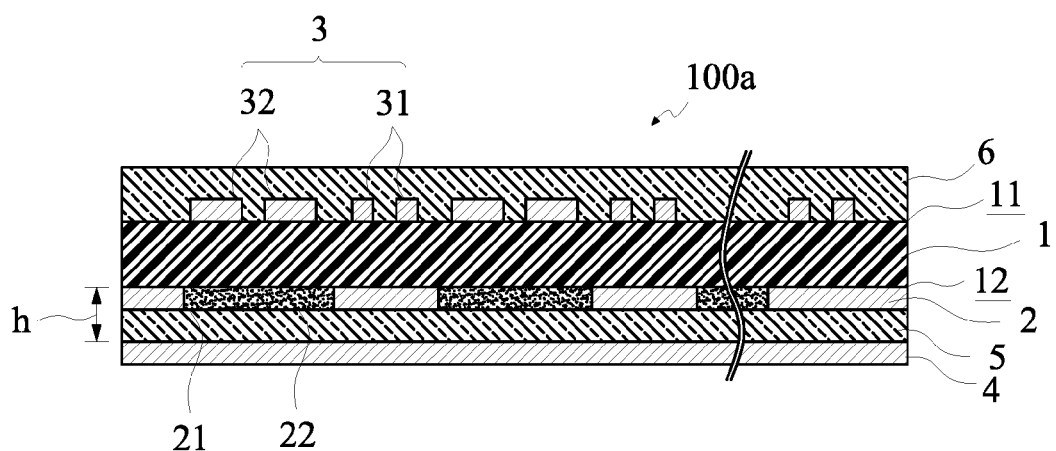
FIG. 5 is a third cross-sectional view illustrating the manufacture of the circuit board according to the second embodiment of the present invention.

FIGS. 3-5 show, in sequence, manufacture of a circuit board structure with selectively corresponding ground layers, generally designated at 100a, according to a second embodiment of the present invention. Constituent components/parts of the instant embodiments are generally identical to those of the first embodiment and same or similar parts are designated with identical reference numerals for correspondence and consistency. As shown in FIG. 3, a first ground layer 2 is formed on a grounding surface 12 of a substrate 1. A plurality of conductor wires 3 is provided, in a manner of being spaced from each other by a spacing distance, on a conductor-laying surface 11 of the substrate 1. The plurality of conductor wires 3 are selectively classified and divided into a first group of conductor wires 31 and a second group of conductor wires 32. The first ground layer 2 is formed with a plurality of non-electromagnetic shield areas 21 at a location corresponding to the second-group conductor wires 32.

Each of the non-electromagnetic shield areas 21 may be an excavated area which can be leveled by being filled with a filling layer 22 (as shown in FIG. 4). The filling layer 22 is formed of one of a low dielectric constant material and a high dielectric constant material.

After the filling layer 22 of the non-electromagnetic shield area 21 is completed, a dielectric layer 5 is set on and covers an undersurface of the first ground layer 2 and the filling layer 22. Finally, a second ground layer 4 is formed on an under surface of the dielectric layer 5 (as shown in FIG. 5).

Figure 6:
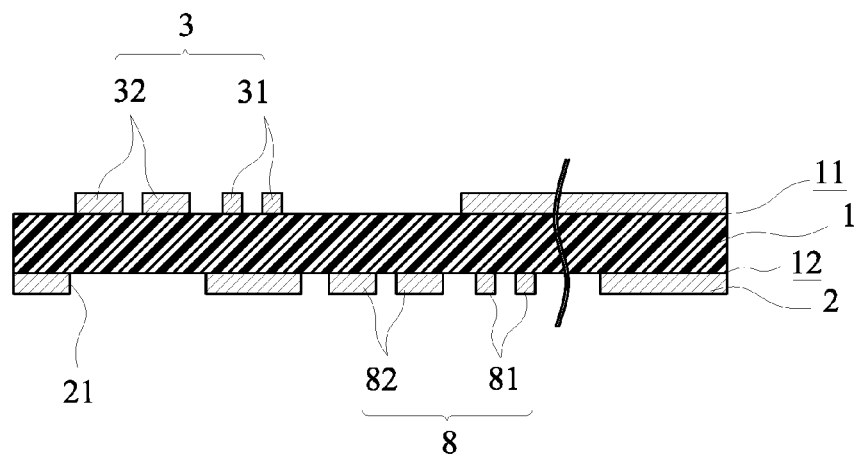
FIG. 6 is a first cross-sectional view illustrating manufacture of a circuit board according to a third embodiment of the present invention.
Figure 7:
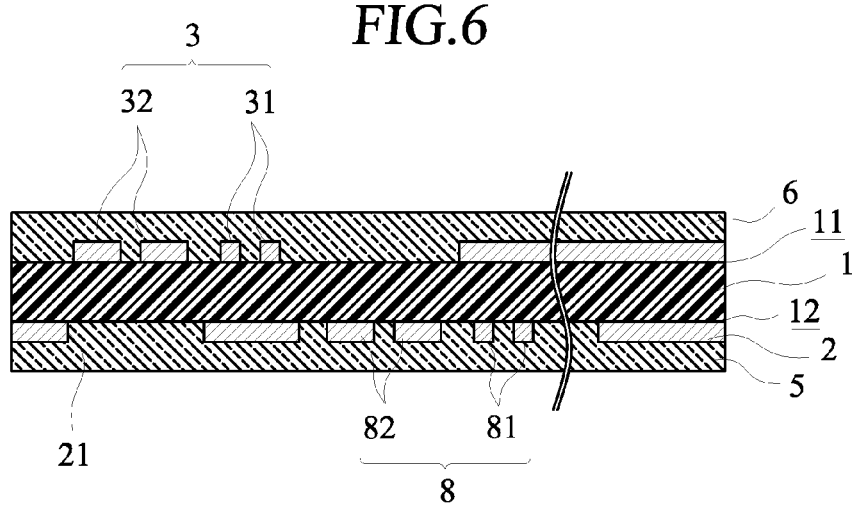
FIG. 7 is a second cross-sectional view illustrating the manufacture of the circuit board according to the third embodiment of the present invention.
Figure 8:
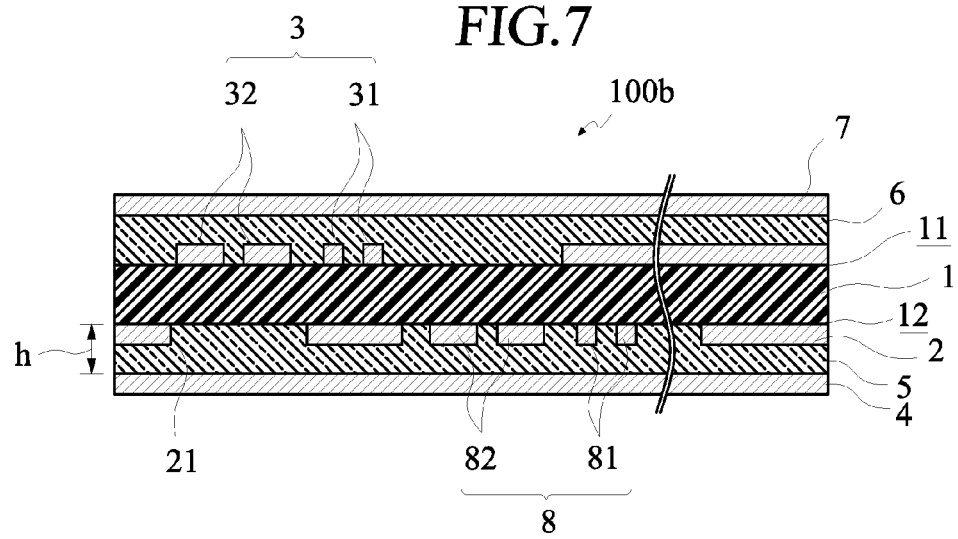
FIG. 8 is a third cross-sectional view illustrating the manufacture of the circuit board according to the third embodiment of the present invention.

FIGS. 6-8 show, in sequence, manufacture of a circuit board structure with selectively corresponding ground layers, generally designated at 100b, according to a third embodiment of the present invention. The structure of the instant embodiment is generally identical to that of the first embodiment illustrated in FIG. 2 and a difference resides in that the first ground layer 2 further comprises internal conductor wires 8 formed therein to be spaced from each other by a spacing distance. The internal conductor wires 8 are selectively classified and divided into a third group of conductor wires 81 and a fourth group of conductor wires 82. A metal layer 7 is formed on the insulation layer 6. The metal layer 7 may function as a ground layer or a shielding layer. In this structure, the third-group conductor wires 81 and the fourth-group conductor wires 82 are arranged to correspond to and couple with different ground layers according to the needs for impedance and may help increase wire distribution density of the conductor wires on the circuit board to thereby improve space utilization.

Figure 9:
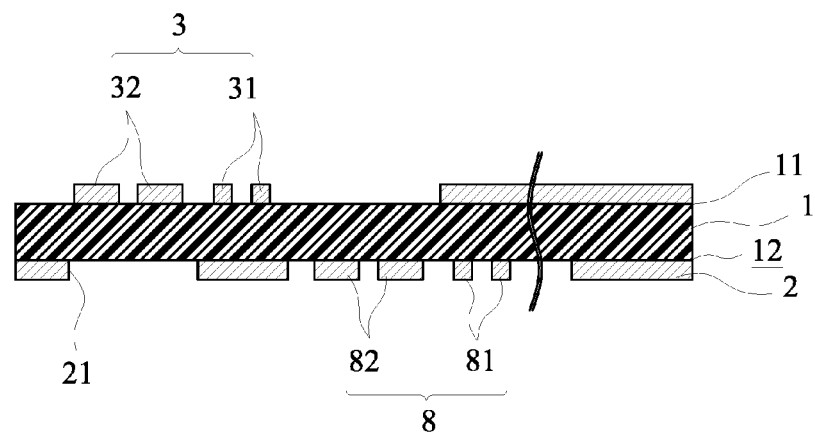
FIG. 9 is a first cross-sectional view illustrating manufacture of a circuit board according to a fourth embodiment of the present invention.
Figure 10:
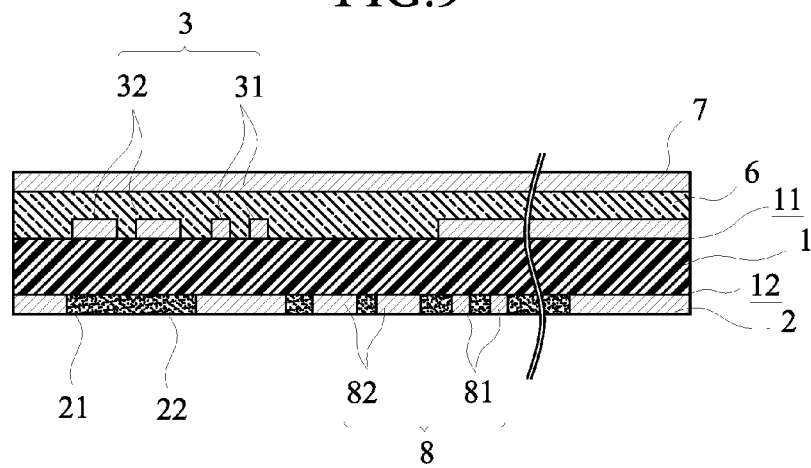
FIG. 10 is a second cross-sectional view illustrating the manufacture of the circuit board according to the fourth embodiment of the present invention.
Figure 11:
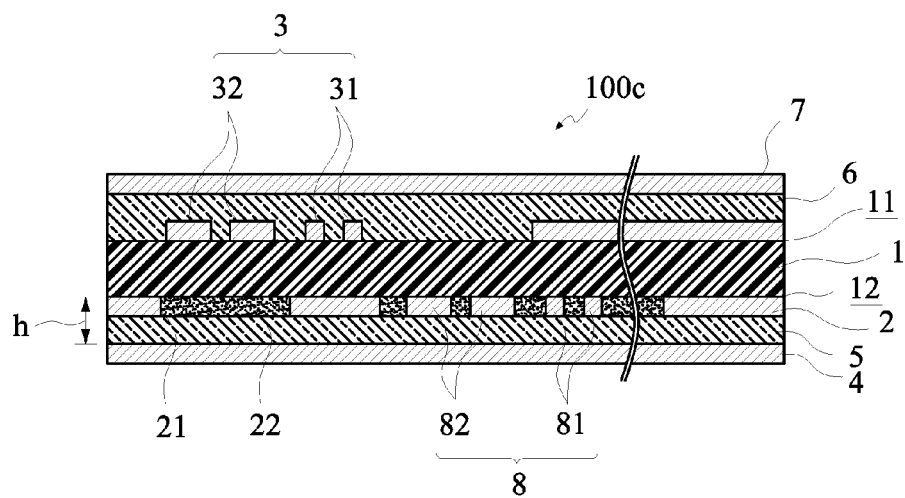
FIG. 11 is a third cross-sectional view illustrating the manufacture of the circuit board according to the fourth embodiment of the present invention.

FIGS. 9-11 show, in sequence, manufacture of a circuit board structure with selectively corresponding ground layers, generally designated at 100c, according to a fourth embodiment of the present invention. The structure of the instant embodiment is generally identical to that of the second embodiment illustrated in FIGS. 3-5 and a difference resides in that the first ground layer 2 further comprises internal conductor wires 8 formed therein to be spaced from each other by a spacing distance. The internal conductor wires 8 are selectively classified and divided into a third group of conductor wires 81 and a fourth group of conductor wires 82. The non-electromagnetic shield area 21 is leveled by filling therein with a filling layer 22. The filling layer 22 is formed of one of a low dielectric constant material and a high dielectric constant material. A metal layer 7 is formed on the insulation layer 6. The metal layer 7 may function as a ground layer or a shielding layer.

In this structure, the third-group conductor wires 81 and the fourth-group conductor wires 82 are arranged to correspond to and couple with different ground layers according to the needs for impedance and may help increase wire distribution density of the conductor wires on the circuit board to thereby improve space utilization.

The embodiments described above are examples of single-layer boards for illustration purposes and the present invention is applicable to structures involving multiple-layered boards or multiple-layered boards combined with jump wires.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A circuit board structure, comprising:
   a substrate extending in an extension direction and including a conductor-laying surface and a grounding surface;
   a first ground layer formed on the grounding surface of the substrate;
   a plurality of spaced conductor wires arranged on the conductor-laying surface, the plurality of conductor wires being selectively classified and divided into a first group of conductor wires and a second group of conductor wires respectively extending along a plurality of laying paths, the first and second groups of conductor wires being disposed in substantially coplanar arrangement on the conductor-laying surface of the substrate;
   a second ground layer located below the first ground layer;
   a dielectric layer arranged between the first ground layer and the second ground layer to define a ground layer height difference between the first ground layer and the second ground layer;
   wherein the first-group conductor wires are arranged to electromagnetically couple to the first ground layer, the second-group conductor wires are arranged to electromagnetically couple to the second ground layer, and the first ground layer defining a plurality of non-electromagnetic shield areas interposed between adjacent grounding segments extend along the laying path of the second-group conductor wires, the second-group conductor wires electromagnetically coupling to the second ground layer through the non-electromagnetic shield areas respectively.

2. The circuit board structure as claimed in claim 1, wherein the plurality of conductor wires includes one of at least a pair of differential-mode signal conductor wires and at least a pair of common-mode signal conductor wires.

3. The circuit board structure as claimed in claim 1, wherein each of the non-electromagnetic shield areas of the first ground layer includes an excavated area filled with and leveled by a filling layer.

4. The circuit board structure as claimed in claim 3, wherein the filling layer is formed of a material selected from one of a high dielectric constant material and a low dielectric constant material.

5. The circuit board structure as claimed in claim 1, wherein each of the non-electromagnetic shield areas of the first ground layer includes an excavated area filled with and leveled by the dielectric layer.

6. The circuit board structure as claimed in claim 1, wherein the substrate is formed of a material including one of polyethylene terephthalate (PET), polyimide (PI), and glass-reinforced epoxy resin (FR4).

7. The circuit board structure as claimed in claim 1, wherein the plurality of conductor wires is divided into the first-group conductor wires and the second-group conductor wires according to one of a conductor wire width limitation and a laying space limitation of the plurality of conductor wires.

8. The circuit board structure as claimed in claim 1, wherein the plurality of conductor wires is divided into the first-group conductor wires and the second-group conductor wires according to one of signal frequency, impedance and signal attenuation toleration.

9. The circuit board structure as claimed in claim 1 further comprising:
   an insulation layer covering the conductor-laying surface of the substrate and the plurality of conductor wires; and
   a metal layer formed on the insulation layer.

10. The circuit board structure as claimed in claim 1, wherein the first ground layer includes a third group of conductor wires and a fourth group of conductor wires spaced from each other and extending along the laying path.

11. The circuit board structure as claimed in claim 1, wherein the first-group conductor wires are electromagnetically coupled to the first ground layer, and the second-group conductor wires are electromagnetically coupled to the second ground layer for control of an impedance value for the first-group conductor wires and the second-group conductor wires.

12. A circuit board structure, comprising:
   a substrate extending in an extension direction and defining an upper conductor-laying surface and a grounding surface;
   a first ground layer formed on the grounding surface of the substrate;
   a plurality of spaced conductor wires on the upper conductor-laying surface, the plurality of conductor wires being selectively classified and divided into a first group of conductor wires and a second group of conductor wires respectively extending along a plurality of laying paths on the upper conductor-laying surface of the substrate;
   a second ground layer located below the first ground layer;
   a dielectric layer arranged between the first ground layer and the second ground layer to define a ground layer height difference between the first ground layer and the second ground layer;
   wherein the first-group conductor wires are arranged to electromagnetically couple to the first ground layer, the second-group conductor wires are arranged to electromagnetically couple to the second ground layer, and the first ground layer defining a plurality of non-electromagnetic shield areas interposed between adjacent grounding segments extend along the laying path of the second-group conductor wires, the second-group conductor wires electromagnetically coupling to the second ground layer through the non-electromagnetic shield areas respectively; and
   wherein each of the non-electromagnetic shield areas of the first ground layer includes an excavated area filled with and leveled by a filling layer, and the filling layer is formed of a material selected from one of a high dielectric constant material and a low dielectric constant material.

13. The circuit board structure as claimed in claim 12, wherein the plurality of conductor wires includes one of at least a pair of differential-mode signal conductor wires and at least a pair of common-mode signal conductor wires.

14. The circuit board structure as claimed in claim 12, wherein the substrate is formed of a material including one of polyethylene terephthalate (PET), polyimide (PI), and glass-reinforced epoxy resin (FR4).

15. The circuit board structure as claimed in claim 12, wherein the plurality of conductor wires is divided into the first-group conductor wires and the second-group conductor wires according to one of a conductor wire width limitation and a laying space limitation of the plurality of conductor wires.

16. The circuit board structure as claimed in claim 12, wherein the plurality of conductor wires is divided into the first-group conductor wires and the second-group conductor wires according to one of signal frequency, impedance and signal attenuation toleration.

17. The circuit board structure as claimed in claim 12 further comprising:
   an insulation layer covering the upper conductor-laying surface of the substrate and the plurality of conductor wires; and
   a metal layer formed on the insulation layer.

18. The circuit board structure as claimed in claim 12, wherein the first ground layer includes a third group of conductor wires and a fourth group of conductor wires spaced from each other and extending along the laying path.

19. The circuit board structure as claimed in claim 12, wherein the first-group conductor wires are electromagnetically coupled to the first ground layer, and the second-group conductor wires are electromagnetically coupled to the second ground layer for control of an impedance value for the first-group conductor wires and the second-group conductor wires.

* * * * *